(12) United States Patent
Murano

(10) Patent No.: US 11,699,567 B2
(45) Date of Patent: Jul. 11, 2023

(54) X-RAY DETECTION APPARATUS AND METHOD

(71) Applicant: JEOL Ltd., Tokyo (JP)

(72) Inventor: Takanori Murano, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 17/534,865

(22) Filed: Nov. 24, 2021

(65) Prior Publication Data

US 2022/0172923 A1    Jun. 2, 2022

(30) Foreign Application Priority Data

Nov. 27, 2020  (JP) ................................. 2020-196725
Oct. 13, 2021  (JP) ................................. 2021-168081

(51) Int. Cl.
  *H01J 37/28*   (2006.01)
  *H01J 37/244*  (2006.01)

(52) U.S. Cl.
  CPC ............ *H01J 37/28* (2013.01); *H01J 37/244* (2013.01); *H01J 2237/2446* (2013.01); *H01J 2237/2801* (2013.01)

(58) Field of Classification Search
  CPC .. H01J 37/28; H01J 37/244; H01J 2237/2446; H01J 2237/2801; H01J 2237/24425; H01J 2237/24585; H01J 2237/2561; H01J 2237/2807; G01N 2223/50; G01N 23/2252
  See application file for complete search history.

(56) References Cited

U.S. PATENT DOCUMENTS

| | | | | |
|---|---|---|---|---|
| 9,841,592 | B2* | 12/2017 | Reed | H01J 37/28 |
| 2002/0003858 | A1* | 1/2002 | Kondo | G01N 23/20 |
| | | | | 378/85 |
| 2002/0158200 | A1* | 10/2002 | Terauchi | H01J 37/256 |
| | | | | 250/310 |
| 2004/0089804 | A1* | 5/2004 | Dantus | H01J 49/164 |
| | | | | 250/423 P |
| 2005/0162650 | A1* | 7/2005 | Yamamoto | G01J 3/04 |
| | | | | 356/328 |
| 2005/0253069 | A1* | 11/2005 | Zewail | H01J 37/243 |
| | | | | 250/311 |

(Continued)

FOREIGN PATENT DOCUMENTS

| | | | |
|---|---|---|---|
| JP | 5484794 A | 7/1979 | |
| JP | 6073447 A | 4/1985 | |

(Continued)

OTHER PUBLICATIONS

Extended European Search Report issued in EP21210240.4 dated Apr. 20, 2022.
Office Action issued in JP2021168081 dated Dec. 13, 2022.

*Primary Examiner* — David A Vanore
(74) *Attorney, Agent, or Firm* — The Webb Law Firm

(57) ABSTRACT

A mask member is provided at an entrance opening of a mirror unit. Of a first diffraction grating and a second diffraction grating, when the second diffraction grating is used, the mask member masks preceding mirrors. With this process, aberration caused by reflective X-ray is suppressed. When the first diffraction grating is used, the mask member does not function. Alternatively, the mask member and another mask member may be selectively used.

8 Claims, 14 Drawing Sheets

(56) References Cited

U.S. PATENT DOCUMENTS

| | | | |
|---|---|---|---|
| 2010/0246768 A1 | 9/2010 | Toraya et al. | |
| 2017/0146787 A1* | 5/2017 | Reed | G01N 23/225 |
| 2019/0049396 A1* | 2/2019 | Murano | G01N 23/2252 |
| 2020/0191733 A1* | 6/2020 | Murano | G01N 23/20008 |
| 2020/0284739 A1* | 9/2020 | Murano | G01N 23/2076 |
| 2021/0302339 A1* | 9/2021 | Murano | G01N 23/2252 |
| 2022/0026378 A1* | 1/2022 | Yokoyama | G01N 23/2252 |

FOREIGN PATENT DOCUMENTS

| | | | |
|---|---|---|---|
| JP | 1195399 A | 8/1989 |
| JP | 2001035080 A | 10/2001 |
| JP | 2001305080 A | 10/2001 |
| JP | 2002329473 A | 11/2002 |
| JP | 2003149184 A | 5/2003 |
| JP | 2007273477 A | 10/2007 |
| JP | 200847451 A | 2/2008 |
| JP | 2010223851 A | 10/2010 |
| JP | 201258146 A | 3/2012 |
| JP | 201258148 A | 3/2012 |
| JP | 2013242413 A | 12/2013 |

* cited by examiner

FIG. 8

| | MASK MEMBER | PRECEDING MIRROR PAIR | FOLLOWING MIRROR PAIR | DIFFRACTION GRATING TO BE USED |
|---|---|---|---|---|
| LOW ENERGY X-RAY MEASUREMENT | (NOT FUNCTIONING) | ENABLED | ENABLED | FIRST DIFFRACTION GRATING |
| HIGH ENERGY X-RAY MEASUREMENT | PRECEDING MIRROR PAIR MASKED | DISABLED | ENABLED | SECOND DIFFRACTION GRATING |

FIG. 11

| | MASK MEMBER | PRECEDING MIRROR PAIR | FOLLOWING MIRROR PAIR | DIFFRACTION GRATING TO BE USED |
|---|---|---|---|---|
| LOW ENERGY X-RAY MEASUREMENT (168) | (NOT FUNCTIONING) | ENABLED | ENABLED | FIRST DIFFRACTION GRATING |
| HIGH ENERGY X-RAY MEASUREMENT (PRIORITY ON ABERRATION SUPPRESSION) (170) | PRECEDING MIRROR PAIR MASKED | DISABLED | ENABLED | SECOND DIFFRACTION GRATING |
| HIGH ENERGY X-RAY MEASUREMENT (PRIORITY ON SENSITIVITY) (172) | (RETRACTED) | ENABLED | ENABLED | SECOND DIFFRACTION GRATING |

FIG. 13

| | MASK MEMBER | PRECEDING MIRROR PAIR | FOLLOWING MIRROR PAIR | DIFFRACTION GRATING TO BE USED |
|---|---|---|---|---|
| LOW ENERGY X-RAY MEASUREMENT (CALIBRATION) | BOTH MIRROR PAIRS MASKED WITH SECOND MASK MEMBER | DISABLED | DISABLED | FIRST DIFFRACTION GRATING |
| HIGH ENERGY X-RAY MEASUREMENT (CALIBRATION) | BOTH MIRROR PAIRS MASKED WITH SECOND MASK MEMBER | DISABLED | DISABLED | SECOND DIFFRACTION GRATING |
| LOW ENERGY X-RAY MEASUREMENT (SAMPLE OBSERVATION) | (TWO MASK MEMBERS RETRACTED) | ENABLED | ENABLED | FIRST DIFFRACTION GRATING |
| HIGH ENERGY X-RAY MEASUREMENT (SAMPLE OBSERVATION) | (TWO MASK MEMBERS RETRACTED) | ENABLED | ENABLED | SECOND DIFFRACTION GRATING |
| LOW ENERGY X-RAY MEASUREMENT (SAMPLE OBSERVATION) | (FIRST MASK MEMBER NOT FUNCTIONING) | ENABLED | ENABLED | FIRST DIFFRACTION GRATING |
| HIGH ENERGY X-RAY MEASUREMENT (SAMPLE OBSERVATION) (PRIORITY ON ABERRATION SUPPRESSION) | PRECEDING MIRROR PAIR MASKED WITH FIRST MASK MEMBER | DISABLED | ENABLED | SECOND DIFFRACTION GRATING |

FIG. 15

|  | | MASK MEMBER | PRECEDING MIRROR PAIR | FOLLOWING MIRROR PAIR | DIFFRACTION GRATING TO BE USED |
|---|---|---|---|---|---|
| 210 | LOW ENERGY X-RAY MEASUREMENT (CALIBRATION) | BOTH MIRROR PAIRS MASKED | DISABLED | DISABLED | FIRST DIFFRACTION GRATING |
| 212 | HIGH ENERGY X-RAY MEASUREMENT (CALIBRATION) | BOTH MIRROR PAIRS MASKED | DISABLED | DISABLED | SECOND DIFFRACTION GRATING |
| 214 | LOW ENERGY X-RAY MEASUREMENT (SAMPLE OBSERVATION) | (NOT FUNCTIONING) | ENABLED | ENABLED | FIRST DIFFRACTION GRATING |
| 216 | HIGH ENERGY X-RAY MEASUREMENT (SAMPLE OBSERVATION) | PRECEDING MIRROR PAIR MASKED | DISABLED | ENABLED | SECOND DIFFRACTION GRATING |

…

X-RAY DETECTION APPARATUS AND METHOD

CROSS REFERENCE TO RELATED APPLICATIONS

This application claims priority to Japanese Patent Application No. 2020-196725 filed Nov. 27, 2020, and Japanese Patent Application No. 2021-168081 filed Oct. 13, 2021, the disclosures of which are hereby incorporated by reference in their entireties.

BACKGROUND OF THE INVENTION

Field of the Invention

The present disclosure relates to an X-ray detection apparatus and method, and in particular to an X-ray detection apparatus having a mirror unit.

Description of Related Art

In recent years, X-ray detection apparatuses attract much attention, and measure a characteristic X-ray belonging to a soft X-ray region. The soft X-ray region is, for example, a region of less than a few hundred eV. By observing and analyzing a spectrum of a characteristic X-ray belonging to the soft X-ray region, a state of a valance band in an atom, more specifically, a chemical bonding state between the atoms, can be clarified. For example, a soft X-ray spectrometer is provided as an X-ray detection apparatus for a scanning electron microscope (SEM), an electron probe microanalyzer (EPMA), or the like.

The soft X-ray spectrometer comprises a mirror unit, a spectroscopic device, a detector, or the like. When an electron beam is illuminated onto an observation point (measurement point) on a sample, various signals are emitted from the observation point to the periphery thereof. These signals include a characteristic X-ray belonging to the soft X-ray region. The characteristic X-ray emitted from the observation point reaches the spectroscopic device via the mirror unit having a light collecting action. In the spectroscopic device, a dispersed emitted X-ray which spatially spreads according to a wavelength distribution is generated from the incident X-ray, and is detected by the detector. At the detector, a plurality of detection values corresponding to a plurality of energies are acquired. A characteristic X-ray spectrum is generated based on the plurality of detection values.

JP 2012-58146 A discloses a diffraction grating (grating) having a plurality of grooves formed with a continuously varying interval. A mirror unit is provided between the diffraction grating and the observation point. No member which partially limits a function of the mirror unit is provided between the observation point and the mirror unit.

In the X-ray detection apparatus having the X-ray spectroscopic function, the mirror unit is provided upstream of the spectroscopic device in order to increase an amount of X-rays reaching the spectroscopic device. As a shape of a reflective surface in the mirror unit, desirably, a shape which can prevent occurrence of an aberration is employed. However, in consideration of the cost or the like, in reality, it has been difficult to employ an ideal shape for the shape of the reflective surface.

When the spectroscopic device has a plurality of diffraction gratings having different characteristics and the diffraction gratings are used in a switching manner, desirably, a mirror unit dedicated for each diffraction grating is provided for each diffraction grating. However, in view of the cost and space, typically, a single mirror unit which is shared by the plurality of diffraction gratings is fixedly provided. In this case, it is very difficult to suppress occurrence of the aberration for all of the plurality of diffraction gratings.

An advantage of the present disclosure lies in reduction of the aberration caused by the mirror unit in a detection apparatus having an X-ray spectroscopic function. Alternatively, an advantage of the present disclosure lies in realizing, in a case in which a single mirror unit is provided corresponding to a plurality of diffraction gratings, a light collection action appropriate for a selected diffraction grating in the mirror unit.

SUMMARY OF THE INVENTION

According to one aspect of the present disclosure, there is provided an X-ray detection apparatus comprising: a mirror unit having a reflective surface which applies light collection on an X-ray from an observation point on a sample; a spectroscopic device that applies spectral dispersion on an X-ray from the mirror unit, to thereby generate a dispersed X-ray which is spatially spread; an X-ray detector that detects the dispersed X-ray; and a mask member that is provided between the observation point and the mirror unit, and that partially covers the reflective surface, to thereby limit a reflective X-ray which is reflected by the reflective surface and reaches the spectroscopic device.

According to another aspect of the present disclosure, there is provided a method of detecting an X-ray, the method comprising: applying, with a mirror unit, light collection on an X-ray from an observation point on a sample; applying, with a spectroscopic device, spectral dispersion on an X-ray from the mirror unit, to thereby generate a dispersed X-ray which is spatially spread; detecting the dispersed X-ray; and covering, with a mask member and at a location between the observation point and the mirror unit, a portion, of a reflective surface of the mirror unit, which causes an aberration, to thereby limit a reflective X-ray which is reflected by the reflective surface and reaches the spectroscopic device.

BRIEF DESCRIPTION OF THE DRAWINGS

Embodiment(s) of the present disclosure will be described based on the following figures, wherein:

FIG. 8 is a diagram showing an operation or an action of each constituting element in an embodiment of the present disclosure;

FIG. 11 is a diagram showing an operation or an action of each constituting element in the first alternative configuration and the second alternative configuration;

FIG. 13 is a diagram showing an operation or an action of each constituting element in the third alternative configuration;

FIG. 15 is a diagram showing an operation or an action of each constituting element in the fourth alternative configuration;

DESCRIPTION OF THE INVENTION

Figure 1:
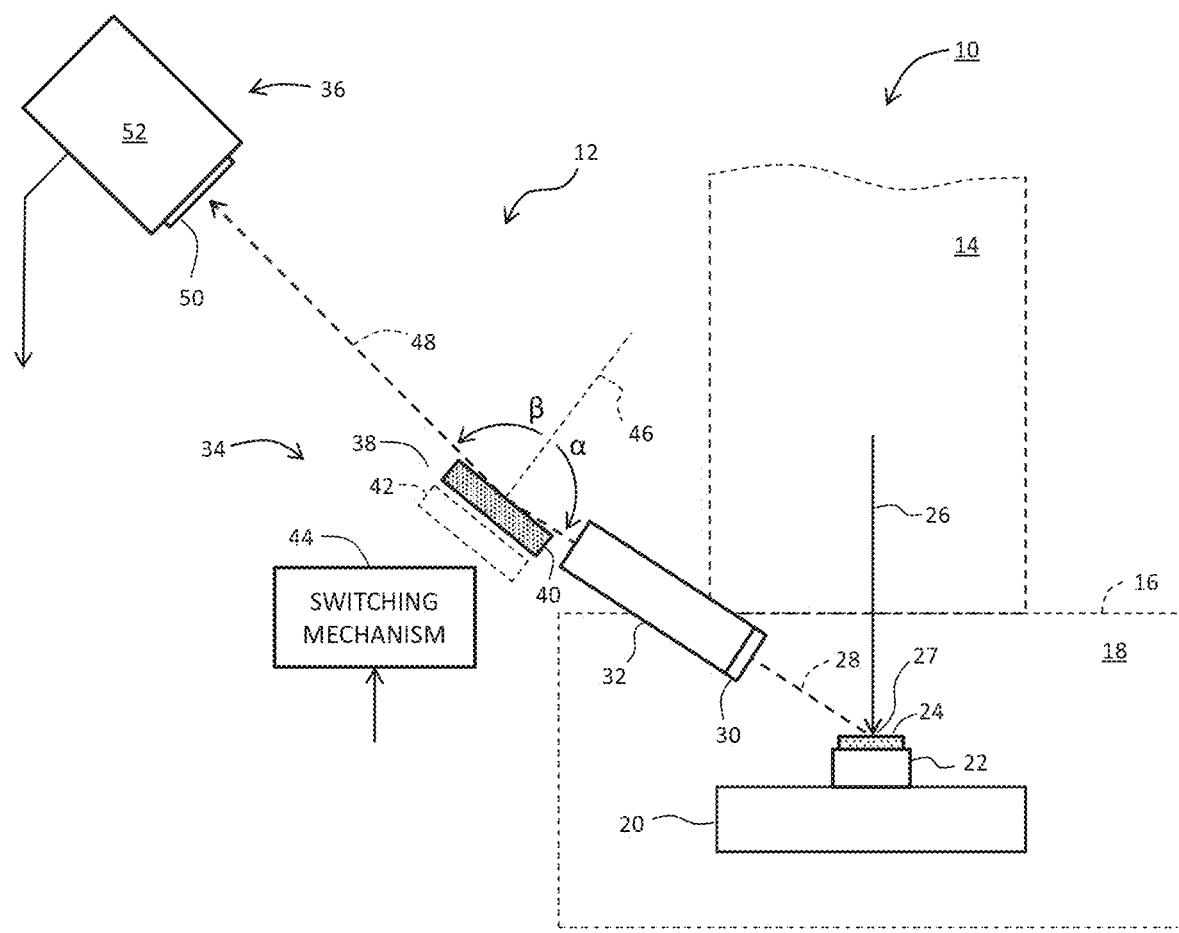
FIG. 1 is a diagram showing an example configuration of an X-ray detection apparatus according to an embodiment of the present disclosure.

An embodiment of the present disclosure will now be described with reference to the drawings.

(1) Overview of Embodiment

An X-ray detection apparatus according to an embodiment of the present disclosure comprises a mirror unit, a spectroscopic device, an X-ray detector, and a mask member. The mirror unit has a reflective surface which applies light collection on an X-ray from an observation point on a sample. The spectroscopic device spectrally disperses the X-ray from the mirror unit, to thereby generate a dispersed X-ray which is spatially spread. The X-ray detector detects the dispersed X-ray. The mask member is provided between the observation point and the mirror unit, and partially covers the reflective surface, to thereby limit a reflective X-ray which is reflected by the reflective surface and reaches the spectroscopic device.

According to the structure described above, a portion, of the reflective surface, which causes a problem such as the aberration can be covered by the mask member to disable this portion. In this manner, the problem can be prevented or reduced while sensitivity by the light collection action is increased. With a presumption of the placement of the mask member, a form of the reflective surface can be simplified. For example, in a case in which a mirror unit shared by a plurality of diffraction gratings having different characteristics must be placed for the plurality of diffraction gratings, the mask member can effectively function. Because the mask member is in general a simple member, the complexity of the X-ray detection apparatus is not significantly increased with the employment of the above-described structure.

The mask member is a member which acts on the X-ray; that is, a member having an X-ray blocking action. As the X-ray to be detected, a characteristic X-ray serving as the soft X-ray may be exemplified, but alternatively, other X-rays may be employed as a detection target. The spectroscopic device comprises a spectroscopic element such as a diffraction grating, a crystal, or the like. By illuminating the sample with an electron beam, an ion beam, an X-ray beam, or the like, a characteristic X-ray is generated from the sample.

In an embodiment of the present disclosure, the spectroscopic device comprises a first diffraction grating and a second diffraction grating which are selectively used. The first diffraction grating is placed at a first position when the first diffraction grating is used. The second diffraction grating is placed at a second position shifted from the first position in a first direction when the second diffraction grating is used. The mask member limits the reflective X-ray reaching the second diffraction grating.

When the same mirror unit is used at a time when the first diffraction grating is used and at a time when the second diffraction grating is used, normally, it is difficult to realize an appropriate light collection action for both diffraction gratings in the mirror unit. In some cases, a large aberration may be caused by a particular portion of the reflective surface in relation to a particular diffraction grating. It is difficult to remove the particular portion in order to avoid the large aberration, and, even if the particular portion is removed, the light collection action would be reduced when other diffraction gratings are used. If it is possible to disable the particular portion only when the particular diffraction grating is used, it becomes possible to realize both the light collection action and the reduction of the aberration. The above-described structure is based on such an idea.

Because the first position and the second position are in a spatial relationship of being shifted from each other, a trajectory of a first reflective X-ray which propagates from the observation point via the reflective surface, and reaching the first diffraction grating, and a trajectory of a second reflective X-ray which propagates from the observation point via the reflective surface, and reaching the second diffraction grating are also in a spatial relationship of being shifted in the first direction. Using such a trajectory shift, it is possible to temporarily cause the mask member to function when the second diffraction grating is used. For example, as a form of the mask, there may be employed a form which allows the X-ray to transmit through in a first range in the first direction, and which blocks the transmission of the X-ray in a second range adjacent to the first range in the first direction.

In an embodiment of the present disclosure, the mirror unit comprises a preceding subunit having two preceding mirrors which are distanced away from each other in a second direction orthogonal to the first direction, and a following subunit having two following mirrors which are distanced away from each other in the second direction. That is, the reflective surface of the mirror unit includes two preceding mirrors and two following mirrors. The mask member covers an entirety or a part of each of the preceding mirrors so that the mask member does not function when the first diffraction grating is used and the reflective X-ray reaching the second diffraction grating is limited when the second diffraction grating is used. In an embodiment of the present disclosure, the preceding subunit is a preceding mirror plate pair, and the following subunit is a following mirror plate pair.

In the second direction, the two preceding mirrors function at an outer side of the two following mirrors. Because of this, the aberrations caused by the reflective X-rays reflected by the two preceding mirrors are larger than the aberrations caused by the reflective X-ray reflected by the two following mirrors. In consideration of this, in the above-described structure, the preceding mirrors are masked.

In an embodiment of the present disclosure, a first energy range in which the first diffraction grating realizes a diffraction action is lower than a second energy range in which the second diffraction grating realizes a diffraction action. In this case, the first diffraction grating covers an X-ray of a relatively longer wavelength, and thus, the aberration is relatively less problematic. When the first diffraction grating is used, both the two preceding mirrors and the two following mirrors function. On the other hand, when the second diffraction grating is used, of the two preceding mirrors and the two following mirrors, the function of the two preceding mirrors is limited. With this limitation, the occurrence of the aberration caused by the two preceding mirrors is prevented or reduced. For example, a center of the first energy range is lower than a center of the second energy range.

In an embodiment of the present disclosure, the preceding subunit has an entrance opening. The mask member is provided at the entrance opening. The entrance opening of the preceding subunit is also an entrance opening of the mirror unit. By attaching the mask member on the mirror unit, a spatial relationship between the mirror unit and the mask member can be more easily set appropriately.

In an embodiment of the present disclosure, the mask member comprises a pair of mask plates which are distanced away from each other in the second direction. The mask plates cover an entirety or a part of each of the preceding mirrors when the second diffraction grating is used. A region between the pair of mask plates functions as an opening for allowing the X-ray to transmit through. A form of each mask plate is optimized according to two X-ray trajectories corresponding to the two diffraction gratings.

In an embodiment of the present disclosure, the mask member comprises a connection plate which connects between one-side ends of a pair of mask plates. According to this structure, because the pair of mask plates are physically integrated, positioning of the mask plates can be facilitated. In addition, when a structure in which the mask member is moved is employed, the movement of the mask member can also be facilitated.

An X-ray detection apparatus according to an embodiment of the present disclosure comprises a movement mechanism. The movement mechanism places the mask member at the entrance opening when a priority-on-aberration-suppression mode is selected, and retracts the mask member from the entrance opening when a priority-on-sensitivity mode is selected. According to this structure, ON/OFF of the function of the mask member can be switched according to whether the aberration suppression is to be prioritized or the sensitivity is to be prioritized. For example, when a single element is analyzed, the priority-on-sensitivity mode may be selected.

An X-ray detection apparatus according to an embodiment of the present disclosure comprises a first mask member and a second mask member. The first mask member functions when the sample is observed. The second mask member is provided between the observation point and the spectroscopic device, functions during calibration, and allows a direct X-ray from the observation point to reach the spectroscopic device and prevents the reflective X-ray from the reflective surface from reaching the spectroscopic device. An X-ray detection apparatus according to an embodiment of the present disclosure further comprises a mechanism that causes the first mask member and the second mask member to selectively function. The mechanism is, for example, a mechanical mechanism.

By causing the second mask member to function during the calibration of the X-ray detection apparatus, calibration precision can be improved. The second mask member may be provided between the observation point and the mirror unit, or in the mirror unit. For example, the second mask member may be provided between the preceding subunit and the following subunit. When the second mask member is provided in the mirror unit, both an X-ray propagating from the observation point toward the reflective surface and the reflective X-ray from the reflective surface may be blocked by the second mask member.

A method of detecting an X-ray according to an embodiment of the present disclosure comprises: a light collection step; a spectral dispersion step; a detection step; and a masking step. In the light collection step, light collection is applied with a mirror unit on an X-ray from an observation point on a sample. In the spectral dispersion step, spectral dispersion is applied on an X-ray from the mirror unit with a spectroscopic device, to thereby generate a dispersed X-ray which is spatially spread. In the detection step, the dispersed X-ray is detected. In the masking step, a portion, of a reflective surface of the mirror unit, which causes an aberration is covered by a mask member at a location between the observation point and the mirror unit. With this process, a reflective X-ray reflected by the reflective surface and reaching the spectroscopic device is limited.

In the method of detecting X-ray described above, an alternative configuration may be considered in which there is provided a mask member which covers an entirety of the reflective surface. For example, such a mask member may be used at the time of calibration or assembly. A further alternative configuration may be considered in which there is provided a mask member which blocks an entirety of an X-ray which propagates directly toward the diffraction grating (direct X-ray) in the X-ray detection apparatus. For example, such a mask member may be used at the time of adjustment or assembly of the mirror unit. Another alternative configuration may be considered in which a mask member which realizes different functions depending on a placement position of the mask member (for example, a placement height) may be provided in the X-ray detection apparatus, and the function of the mask member may be selected by selecting the placement position. These alternative configurations may individually form independent characteristic features.

(2) Details of Embodiment

FIG. 1 shows an example configuration of a sample observation system according to an embodiment of the present disclosure. The sample observation system comprises a scanning electron microscope 10 and a soft X-ray spectrometer 12. The soft X-ray spectrometer 12 is one type of an X-ray detection apparatus.

The scanning electron microscope 10 comprises a lens barrel 14. In the lens barrel 14, an electron gun, a deflection lens, an object lens, and the like are provided. At a lower side of the lens barrel 14, a housing 16 is provided, and an inside of the housing 16 is a sample chamber 18. In the sample chamber 18, a movable stage 20 is placed. A holder 22 holding a sample 24 is fixed with respect to the movable stage 20. When an electron beam 26 is illuminated onto an observation point 27 on the sample 24, a plurality of signals are emitted from the observation point 27. The plurality of signals include secondary electrons, back-scattered electrons, characteristic X-rays, and the like. The soft X-ray spectrometer 12 spectrally disperses and detects the characteristic X-ray (in particular, characteristic X-rays belonging to a soft X-ray region). The soft X-ray is, for example, an X-ray having an energy of less than 300 eV, less than 200 eV, or less than 100 eV. A lower limit of a measurement range is, for example, a few tens of eV, and is more specifically 30 eV, 40 eV, or 50 eV. In reality, an energy range for which spectral dispersion is possible; that is, an energy range which can be measured, is determined according to a characteristic of a diffraction grating to be used.

The soft X-ray spectrometer 12 comprises a mirror unit 32, a spectroscope (spectroscopic device) 34, and a detection unit 36. In the present embodiment, the soft X-ray spectrometer 12 further comprises a mask member 30. Details of the mask member 30 will be described later.

In the present embodiment, the mirror unit 32 is formed from a plurality of subunits arranged along a propagation direction of the X-ray, and is more specifically formed from a preceding subunit and a following subunit. With the light collection action by the mirror unit 32, a detection sensitivity of the X-ray, more specifically, an intensity of the X-ray propagating toward the spectroscope 34, can be increased. Details of this process will be described later.

In the illustrated example configuration, the spectroscope 34 comprises a first diffraction grating 40 and a second diffraction grating 42, which are selectively used. When the first diffraction grating 40 is used, the first diffraction grating is provided at a first position. In this case, the second diffraction grating 42 is provided at a standby position. When the second diffraction grating 42 is used, the second diffraction grating 42 is provided at a second position different from the first position. In this case, the first diffraction grating 40 is provided at a standby position.

The spectroscope 34 comprises a switching mechanism 44. The switching mechanism 44 has a member (such as a turntable, a slider, or the like) on which the first diffraction grating (first grating) 40 and the second diffraction grating (second grating) 42 are mounted. In addition, the switching mechanism 44 has a drive source for driving this member.

FIG. 1 shows a usage stage of the first diffraction grating 40. Each of the first diffraction grating 40 and the second diffraction grating 42 has a plurality of grooves formed with a continuously varying interval. By making the interval non-uniform, occurrence of the aberration is suppressed. The first diffraction grating 40 functions, for example, in an energy range of 50-170 eV or 100-400 eV. The second diffraction grating 42 functions, for example, in an energy range of 70-210 eV or 350-2300 eV. The energy ranges described above include those which cover a region exceeding the soft X-ray region. In the present disclosure, the numerical values described herein are merely exemplary.

In FIG. 1, reference numeral 28 shows an X-ray which propagates from the observation point 27 toward the first diffraction grating 40 (incident X-ray). In reality, the X-rays reaching the first diffraction grating 40 include a direct X-ray which is not affected by an action of the reflective surface of the mirror unit 32, and a reflective X-ray which is generated by reflection at the reflective surface of the mirror unit 32. In FIG. 1, reference numeral 48 shows an emitted X-ray emitted from the first diffraction grating 40. The emitted X-ray 48 is a dispersed X-ray which is spatially spread. That is, at the first diffraction grating 40, the X-ray components are split for each wavelength, and the X-ray components are emitted with different angles from each other. The plurality of X-ray components as a whole are the dispersed X-ray. In FIG. 1, reference numeral 46 shows a line of normal passing through a center of the first diffraction grating 40, α shows an angle of incidence, and β shows an angle of emission.

In the above description, the use of the first diffraction grating 40 is assumed, but a similar description is applicable when the second diffraction grating 42 is used. An incidence angle condition in the case when the first diffraction grating 40 is used and an incidence angle condition in the case when the second diffraction grating 42 is used differ from each other.

The detection unit 36 is formed from a detector 50 and a controller 52. The detector 50 is formed from, for example, a CCD detector formed from a plurality of detection cells which are two-dimensionally arranged. The controller 52 controls an operation of the detector 50, processes an output signal of the detector 50, and outputs the processed output signal to an information processor. At the information processor, a characteristic X-ray spectrum is generated based on a signal which is input. Based on the characteristic X-ray spectrum, a qualitative analysis and a quantitative analysis of the sample 24 are executed.

Figure 2:
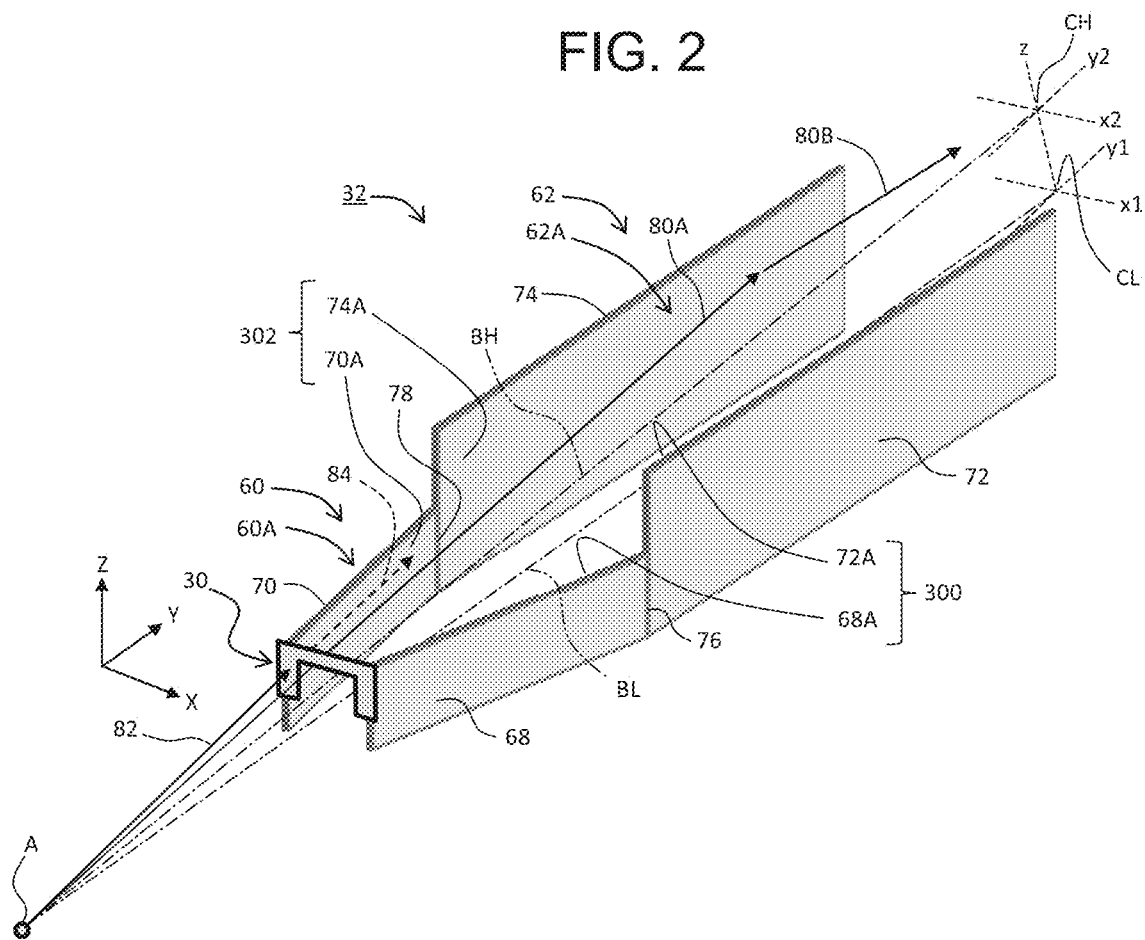
FIG. 2 is a perspective diagram of a mirror unit.

FIG. 2 shows the mask member 30 and the mirror unit 32. First, the mirror unit 32 will be described.

In FIG. 2, an x1 axis and a y1 axis are defined for the first diffraction grating which covers a relatively low energy range. The x1 axis and the y1 axis are orthogonal to each other. A z axis is an axis orthogonal to the x1 axis and the y1 axis, and corresponds to a line of normal of the first diffraction grating. An x2 axis and a y2 axis are defined for the second diffraction grating covering a relatively high energy range. The x2 axis and the y2 axis are orthogonal to each other. The z axis is an axis orthogonal to the x2 axis and the y2 axis, and corresponds to a line of normal of the second diffraction grating. Thus, a position shifted in the z direction from the first position on which the first diffraction grating is placed is the second position on which the second diffraction grating is placed. Alternatively, the line of normal of the first diffraction grating and the line of normal of the second diffraction grating may set to differ from each other.

A form of the first diffraction grating is in reality a gradual concave surface, but when the concave surface is approximated by a plane, two axes defining the plane are the x1 axis and the y1 axis. Similarly, although a form of the second diffraction grating is in reality a gradual concave surface, when the concave surface is approximated by a plane, two axes defining the plane are the x2 axis and the y2 axis.

A center point of the first diffraction grating is shown by CL, and a center point of the second diffraction grating is shown by CH. A distance between the center points is in reality about a few mm, but in FIG. 2, the distance is shown in an exaggerated manner. BL shows a trajectory from the observation point A toward the center point CL, and BH shows a trajectory from the observation point A toward the center point CH. The trajectory BH is shifted in the z direction with respect to the trajectory BL.

FIG. 2 also shows a coordinate system of the mirror unit 32. An X axis is parallel to the x1 axis and the x2 axis. A Y axis is a direction of arrangement of a preceding mirror plate pair 60 and a following mirror plate pair 62 to be described below. The Y axis is slightly inclined with respect to the y1 axis and the y2 axis. A Z axis is orthogonal to the X axis and the Y axis, and is slightly inclined with respect to the z axis.

The mirror unit 32 is a mirror system which realizes the light collection action. As already described, the mirror unit 32 comprises the preceding mirror plate pair 60 and the following mirror plate pair 62. The mirror plate pairs are arranged in the Y direction. Alternatively, it may be understood that the mirror plate pairs are arranged in the y1 direction or the y2 direction. The preceding mirror plate pair 60 has a preceding mirror pair 60A, and the following mirror plate pair 62 has a following mirror pair 62A. The reflective surface of the mirror unit 32 is formed from the preceding mirror pair 60A and the following mirror pair 62A.

More specifically, the preceding mirror plate pair 60 is formed from two mirror plates 68 and 70 placed in a distanced manner from each other in the direction of the X axis. Two surfaces realizing the X-ray reflection action in the two mirror plates 68 and 70 are two preceding mirrors 68A and 70A. The preceding mirror pair 60A described above is formed from the two preceding mirrors 68A and 70A.

The following mirror plate pair 62 is formed from two mirror plates 72 and 74 placed in a distanced manner from each other in the direction of the X axis. Two surfaces realizing the X-ray reflection action in the two mirror plates 72 and 74 are two following mirrors 72A and 74A. The following mirror pair 62A described above is formed from the two following mirrors 72A and 74A.

From another viewpoint, a mirror array 300 is formed from the preceding mirror 68A and the following mirror 72A, and a mirror array 302 is formed from the preceding mirror 70A and the following mirror 74A. A connection portion between the preceding mirror 68A and the following mirror 72A is shown by reference numeral 76, and a connection portion between the preceding mirror 70A and the following mirror 74A is shown by reference numeral 78. In the mirror array 300, the preceding mirror 68A is more inclined with respect to the Y axis than the following mirror 72A, and, similarly, in the mirror array 302, the preceding mirror 68A is more inclined with respect to the Y axis than the following mirror 72A.

When viewed from the trajectory BL and the trajectory BH, the two preceding mirrors 68A and 70A realize a reflection action with respect to an X-ray which is emitted to an outer side in relation to the two following mirrors 72A and 74A. As such, a trajectory length of an X-ray propagating from the observation point A, reflected by the two preceding mirrors 68A and 70A, and propagating toward the diffraction grating is longer than a trajectory length of an X-ray propagating from the observation point A, reflected by the two following mirrors 72A and 74A, and propagating toward the diffraction grating. In other words, a larger aberration occurs due to the two preceding mirrors 68A and 70A. When the first diffraction grating covering the low energy range is used, because the wavelength of the X-ray is long, the problem of the aberration is not significant, but when the second diffraction grating covering the high energy range is used, because the wavelength of the X-ray is short, the problem of the aberration cannot be ignored.

Based on the above, in the present embodiment, when the second diffraction grating is used, there is provided the mask member 30 which blocks the X-ray incident on the preceding mirrors 68A and 70A, so as to prevent reflection of the X-ray at the preceding mirrors 68A and 70A.

More specifically, when the first diffraction grating is used, the trajectory BL is positioned at a lower side, and the mask member 30 substantially does not function. The direct X-ray, the reflective X-ray which is reflected by the following mirrors 72A and 74A, and the reflective X-ray reflected by the preceding mirrors 68A and 70A reach the first diffraction grating. These X-rays reach the detector after being diffracted at the first diffraction grating. In FIG. 2, an X-ray incident on the following mirror 74A is shown by reference numeral 80A, and an X-ray reflected by the following mirror 74A is shown by reference numeral 80B.

On the other hand, when the second diffraction grating is used, the trajectory BH is positioned at an upper side, and the mask member 30 functions. When viewed from the observation point A, the preceding mirrors 68A and 70A are masked by the mask member 30. That is, an X-ray 82 propagating toward the preceding mirrors 68A and 70A is blocked by the mask member 30. No X-ray 84 reaching the preceding mirror 70A is caused. As a result, the direct X-ray and the reflective X-ray reflected by the following mirrors 72A and 74A reach the second diffraction grating. These X-rays reach the detector after being diffracted at the second diffraction grating.

A shape of the mask member 30 is defined such that the blocking function is switched ON and OFF according to the diffraction grating to be used. Each of the mirror plates 68, 70, 72, and 74 is a simple flat plate, and is formed from, for example, a silicon substrate. Each of the mirrors 68A, 70A, 72A, and 74A is formed from, for example, a gold-deposited layer.

Figure 3:
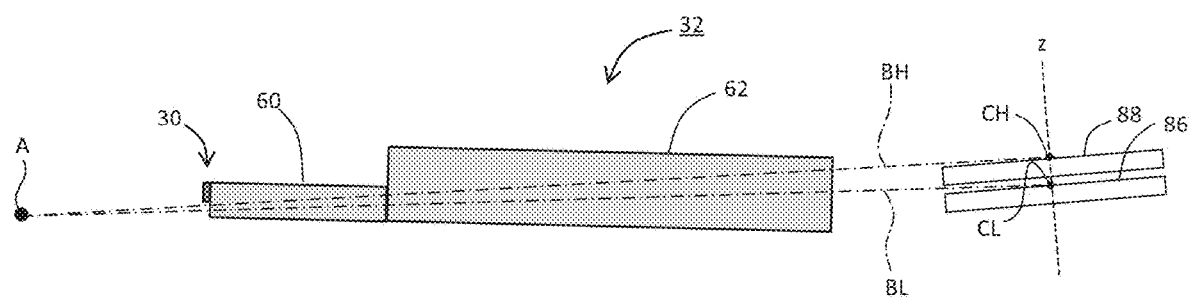
FIG. 3 is a side view of a mirror unit.

FIG. 3 shows a side surface of the mirror unit 32. In FIG. 3, constituting elements which are already described are assigned the same reference numerals as the constituting elements already described, and will not be described again. This is similarly applicable to FIG. 4 and on.

FIG. 3 shows a first diffraction grating 86 which covers a low energy range, and a second diffraction grating 88 which covers a high energy range. The first position at which the first diffraction grating 86 is placed and the second position at which the second diffraction grating 88 is placed are shifted from each other in the z direction. With this shift, the two trajectories BL and BH extending from the observation point A are shifted from each other in the z direction. The preceding mirror plate pair 60 and the following mirror plate pair 62 are spread in an up-and-down direction so that a sufficient amount of X-rays reach the first diffraction grating 86 and the second diffraction grating 88. The preceding mirror plate pair 60 and the following mirror plate pair 62 are slightly inclined with respect to the trajectories BL and BH, but alternatively, the preceding mirror plate pair 60 and the following mirror plate pair 62 may be placed such that the mirror plate pairs are parallel to either of the trajectories BL and BH.

As described, because the placement positions of the two diffraction gratings 86 and 88 differ from each other, and the trajectories BL and BH are consequently shifted in the up-and-down direction, even when the mask member 30 is fixedly placed, the mask action may be automatically switched ON and OFF.

Figure 4:
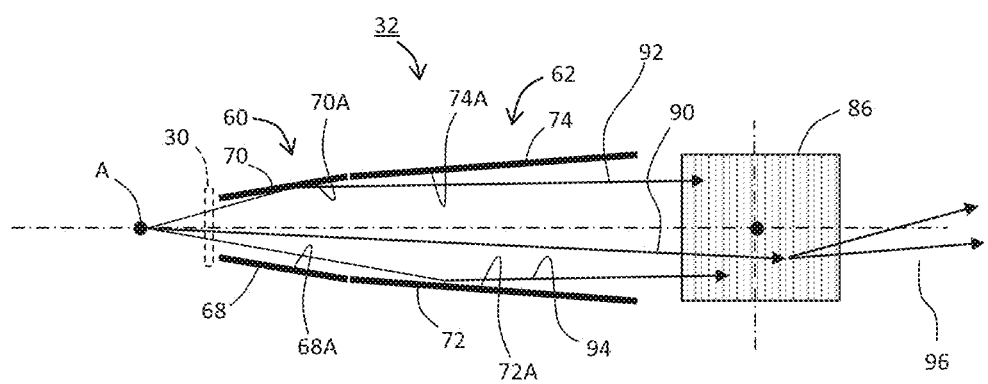
FIG. 4 is a diagram showing an action of a mirror unit when a first diffraction grating is used.

FIG. 4 shows an action of the mirror unit 32 when the first diffraction grating 86 is used. In this case, the mask member 30 does not function. That is, all of the mirrors 68A, 70A, 72A, and 74A function. A direct X-ray 90, a reflective X-ray 92, and a reflective X-ray 94 reach the first diffraction grating 86. Reference numeral 96 shows a dispersed X-ray generated after the diffraction.

Figure 5:
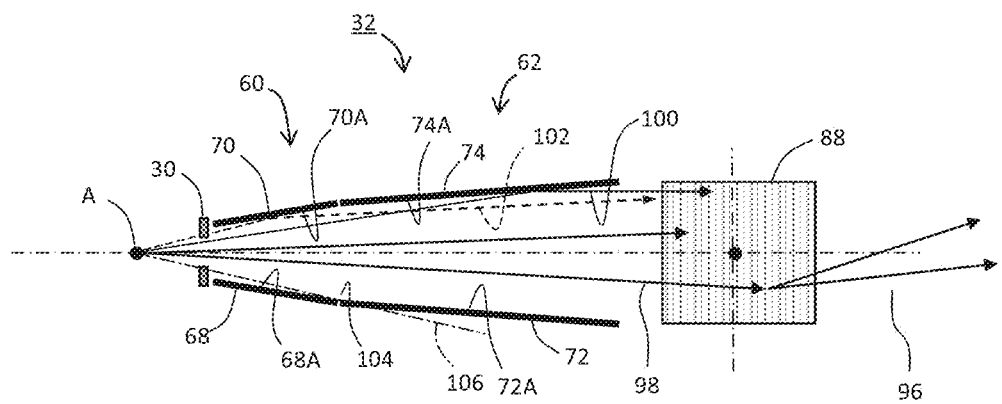
FIG. 5 is a diagram showing an action of a mirror unit and a mask member when a second diffraction grating is used.

FIG. 5 shows an action of the mirror unit 32 when the second diffraction grating 88 is used. In this case, the mask member 30 functions. That is, of the mirrors 68A, 70A, 72A, and 74A, actions of the mirrors 68A and 70A are disabled. A direct X-ray 98 and a reflective X-ray 100 reach the second diffraction grating 88. Reference numeral 96 shows the dispersed X-ray generated after the diffraction. A reflective X-ray 102 shown with a broken line does not reach the second diffraction grating 88.

A region having a height greater than or equal to a height which allows reaching to the second diffraction grating 88 and which is outside of a line 106 connecting the observation point A and a connection portion 104 is the region in which the blocking by the mask member 30 is realized.

Figure 6:
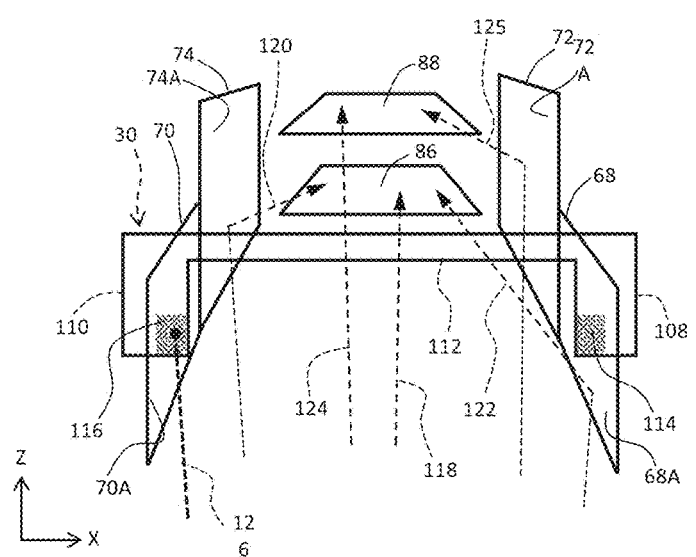
FIG. 6 is a diagram for explaining a structure and an action of a mask member.

FIG. 6 is a front view of the mask member 30. For the purpose of convenience, the mask member 30 is shown with a broken line. At a rear side of the mask member 30, the mirror plates 68, 70, 72, and 74 are provided, and, at a further rear side, the first diffraction grating 86 and the second diffraction grating 88 are selectively placed. The mirror plates 68, 70, 72, and 74 have the mirrors 68A, 70A, 72A, and 74A.

When the second diffraction grating 88 is used, the mask member 30 masks the mirrors 68A and 70A, among the mirrors 68A, 70A, 72A, and 74A. Actual mask regions are shown with reference numerals 114 and 116 (refer to gray portions). A position and a form of the mask region may vary depending on a structure of the mirror unit and a spatial relationship between the mirror unit and the mask member. Lower sides of the two mask regions 114 and 116 are opened, and, when the first diffraction grating is used, the function of the mirrors 68A and 70A is enabled.

In the illustrated example structure, the mask member 30 has a form of an arch shape or a bridge shape. The mask member 30 is more specifically formed from two legs 108 and 110 and a connection portion 112 connecting upper ends of the legs. The legs 108 and 110 are respectively mask plates, and a part of lower ends thereof functions as the mask regions 114 and 116. The mask member 30 is formed from, for example, a metal plate. As the metal, copper or the like may be exemplified. The X-ray transmits through an opening between the two legs 108 and 110. In addition, the X-ray transmits through opening portions at lower sides of the two legs 108 and 110.

Alternatively, the connection portion 112 may be omitted. However, with the structure of the present embodiment, positioning of the two legs 108 and 110 can be facilitated, and, even when the mask member 30 is transported, the transport can be facilitated. The mask member 30 is attached on an entrance opening of the mirror unit. With this configuration, determination of the spatial relationship between the mask member 30 and the mirror unit can be facilitated. Alternatively, a connection portion may be provided to connect lower ends of the two legs 108 and 110.

In FIG. 6, when the first diffraction grating 86 is used, a direct X-ray 118, a reflective X-ray 120, and a reflective X-ray 122 reach. When the second diffraction grating 88 is used, a direct X-ray 124 and a reflective X-ray 125 reach. An X-ray 126 propagating toward the preceding mirrors 68A and 70A is blocked by the mask member 30.

Figure 7:
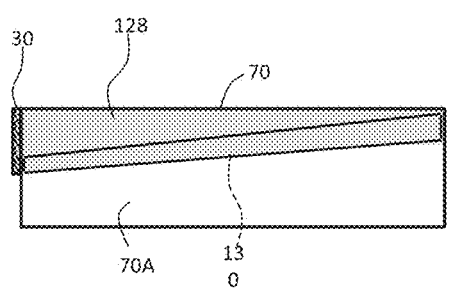
FIG. 7 is a diagram exemplifying a portion, of a preceding mirror, covered by a mask member.

FIG. 7 shows the preceding mirror plate 70. Of the preceding mirror 70A, a portion which becomes a shadow of the mask member 30 is a gray region 128. Of this region, a region 130 is a region which causes the reflective X-ray propagating toward the second diffraction grating. When the first diffraction grating is used, the region 130 functions, and the reflective X-ray is generated in this region. This is similarly applicable to the other preceding mirror plate. A form and a position of the region 130 may vary depending on the positional relationship of various members, and the illustrated configuration is merely exemplary.

FIG. 8 summarizes the functions or actions of the constituting elements in the present embodiment. Reference numeral 138 shows presence/absence of the function of the mask member, reference numeral 140 shows presence/absence of the function of the preceding mirror pair, and reference numeral 142 shows presence/absence of the function of the following mirror pair. Reference numeral 144 shows a diffraction grating which is used.

In a case of low energy X-ray measurement 134, the first diffraction grating is selected, the mask member does not function, and both the preceding mirror pair and the following mirror pair function. In a case of high energy X-ray measurement 136, the second diffraction grating is selected, and the mask member functions. The preceding mirror pair is disabled, and only the function of the following mirror pair is enabled.

As described, according to the present embodiment, when the second diffraction grating is used, of the reflective surface of the mirror unit, a particular portion is masked and is disabled, so that occurrence of a problem due to aberration can be prevented or reduced. In addition, in the present embodiment, it is not necessary to move the mask member, and the mask member can be fixedly placed. Therefore, complication of the device structure can be avoided. With the use of the mask member, the shape of the reflective surface of the mirror unit can be easily simplified, and design and fabrication of the reflective surface can thus be facilitated.

Figure 9:
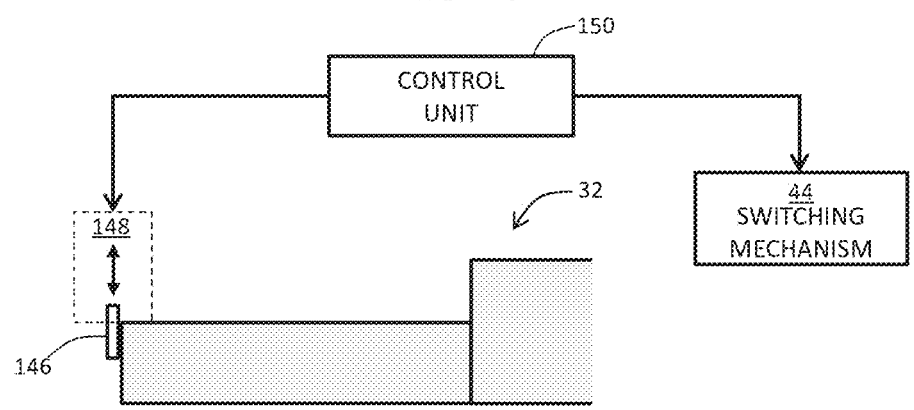
FIG. 9 is a diagram showing a first alternative configuration.

FIG. 9 shows a first alternative configuration. The switching mechanism 44 is a mechanism which selects a diffraction grating to be used from the first diffraction grating and the second diffraction grating, and which places the selected diffraction grating at an appropriate position. An operation of the switching mechanism 44 is controlled by a control unit 150.

At the entrance opening of the mirror unit 32, a mask member 146 is provided. Similar to the mask member shown in FIG. 6, the mask member 146 masks the preceding mirror pair when the second diffraction grating is used. In the first alternative configuration, the mask member 146 is provided in a manner to allow loading and unloading. That is, a transport mechanism 148 for transporting the mask member 146 is provided. For example, when a priority-on-aberration-suppression mode is selected, the mask member 146 is placed at the entrance opening. On the other hand, when a priority-on-sensitivity mode is selected, the mask member 146 is taken out from the entrance opening, and is transported to a standby position. An operation of the transport mechanism is controlled by the control unit 150.

According to the first alternative configuration, in a situation in which the aberration is not problematic, the function of the mask member can be disabled, and an amount of X-ray reaching the second diffraction grating can be increased.

Figure 10:
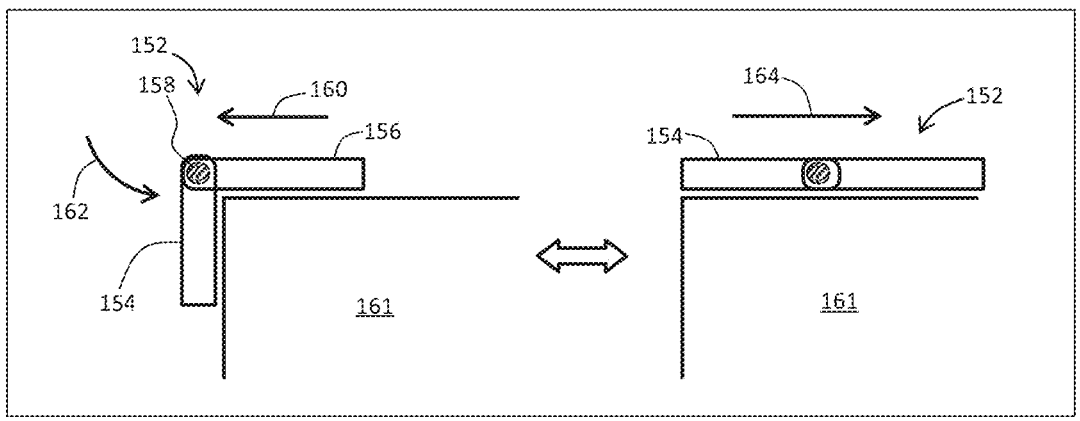
FIG. 10 is a diagram showing a second alternative configuration.

FIG. 10 shows a second alternative configuration. At a left side of FIG. 10, a mask mechanism 152 comprises a mask member 154 and a support member 156. Specifically, the support member 156 is connected to an upper end of the mask member 154 via a hinge portion 158. The mask member 154 rotates or swings about the hinge portion 158. As shown by reference numeral 160, when the mask mechanism 152 moves to a left direction, the mask 154 which is no longer held by a mirror unit 161 hangs downward as shown by reference numeral 162. With this process, the mask member 154 can be placed at the entrance opening of the mirror unit 161. On the other hand, as shown by reference numeral 164 at a right side in FIG. 10, when the mask mechanism 152 is moved to the right side, the mask member 154 is flipped by the mirror unit 161, and assumes a horizontal orientation.

According to the second alternative configuration, a space required for placement of the mask mechanism can be reduced. In other words, the mask mechanism 152 can be placed in a narrow space. Alternatively, an operation member may be connected to the mask mechanism 152, and the mask mechanism 152 may be moved forward and backward by the operation member. The mask member 154 has a form and an action similar to those of the mask member shown in FIG. 6.

FIG. 11 shows functions or actions of various constituting elements in the first alternative configuration and the second alternative configuration. In low energy X-ray measurement 168, the first diffraction grating is selected, the mask member does not function, and the preceding mirror pair and the following mirror pair function. When high energy X-ray measurement is executed in the priority-on-aberration-suppression mode (refer to reference numeral 170), the second diffraction grating is selected, the mask member functions, the preceding mirror pair is masked, and only the following mirror pair functions. When the high energy X-ray measurement is executed in the priority-on-sensitivity mode (refer to reference numeral 172), the second diffraction grating is selected, the mask member does not function, and the preceding mirror pair and the following mirror pair function.

Figure 12:
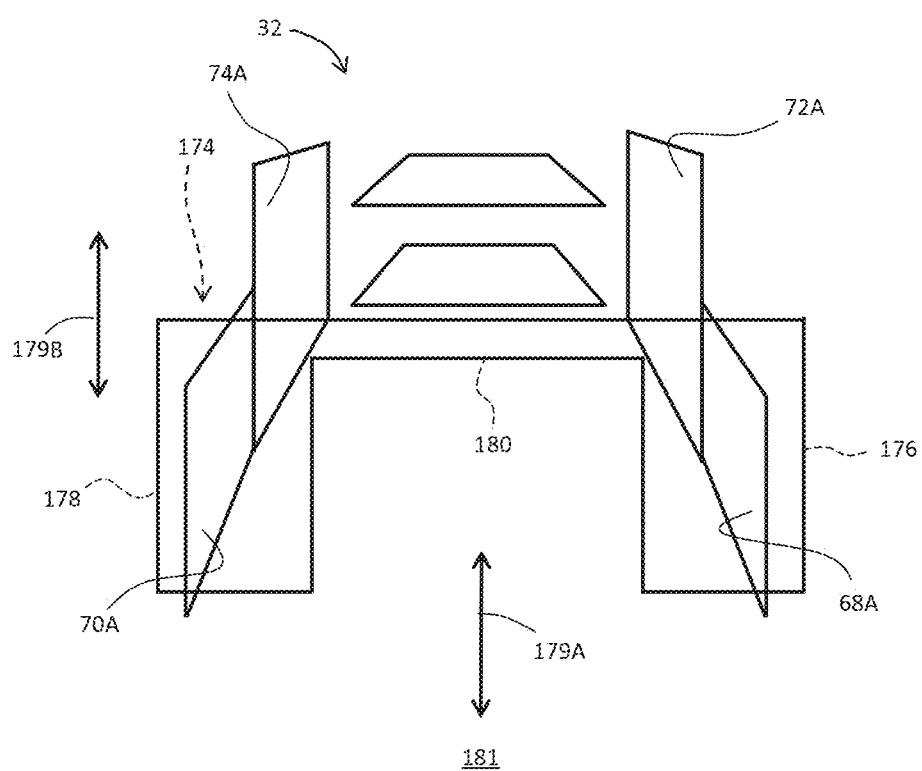
FIG. 12 is a diagram showing a third alternative configuration.

FIG. 12 shows a third alternative configuration. At the entrance opening of the mirror unit 32, a first mask member 181 and a second mask member 174 are selectively placed. The first mask member 181 is the mask member shown in FIG. 6. The second mask member 174 is a member which masks all of the mirrors 68A, 70A, 72A, and 74A. For example, during calibration or assembly, in particular during checking of the operation of the diffraction grating, when it is desired to not allow the reflective X-ray to be incident on the diffraction grating, the second mask member 174 is used. The second mask member 174 has two legs 176 and 178, and a connection portion 180 connecting the legs.

As shown by reference numeral 179A, the first mask member 181 slides between the entrance opening and a first standby position. As shown by reference numeral 179B, the second mask member 174 slides between the entrance opening and a second standby position. These two slide motions are controlled by a control unit (not shown). Alternatively, the first mask member 181 and the second mask member 174 may slide in a left-and-right direction of the page of the figure.

FIG. 13 shows functions or actions of various constituting elements in the third alternative configuration. When the low energy X-ray measurement is executed during calibration (refer to reference numeral 184), the first diffraction grating is selected, the second mask member is introduced, and the preceding mirror pair and the following mirror pair are masked. When the high energy X-ray measurement is executed during the calibration (refer to reference numeral 185), the second diffraction grating is selected, and, similar to the above, the second mask member is introduced and the preceding mirror pair and the following mirror pair are masked.

When the low energy X-ray measurement is executed with priority on the sensitivity while maintaining retracted states of the two mask members during sample observation (refer to reference numeral 186), the first diffraction grating is selected, and the functions of the preceding mirror pair and the following mirror pair are enabled. When the high energy X-ray measurement is executed with priority on the sensitivity while maintaining the retracted states of the two mask members during the sample observation (refer to reference numeral 187), the second diffraction grating is selected, and the functions of the preceding mirror pair and the following mirror pair are enabled.

When the low energy X-ray measurement is executed with priority on the sensitivity in a state in which the first mask member is introduced during the sample observation (refer to reference numeral 188), the first diffraction grating is selected, the first mask member does not function, and the functions of the preceding mirror pair and the following mirror pair are enabled. When the high energy X-ray measurement is executed with priority on the aberration suppression in a state in which the first mask member is introduced during the sample observation (refer to reference numeral 189), the second diffraction grating is selected, the first mask member functions, the preceding mirror pair is thus masked, and only the function of the following mirror pair is enabled.

Figure 14:
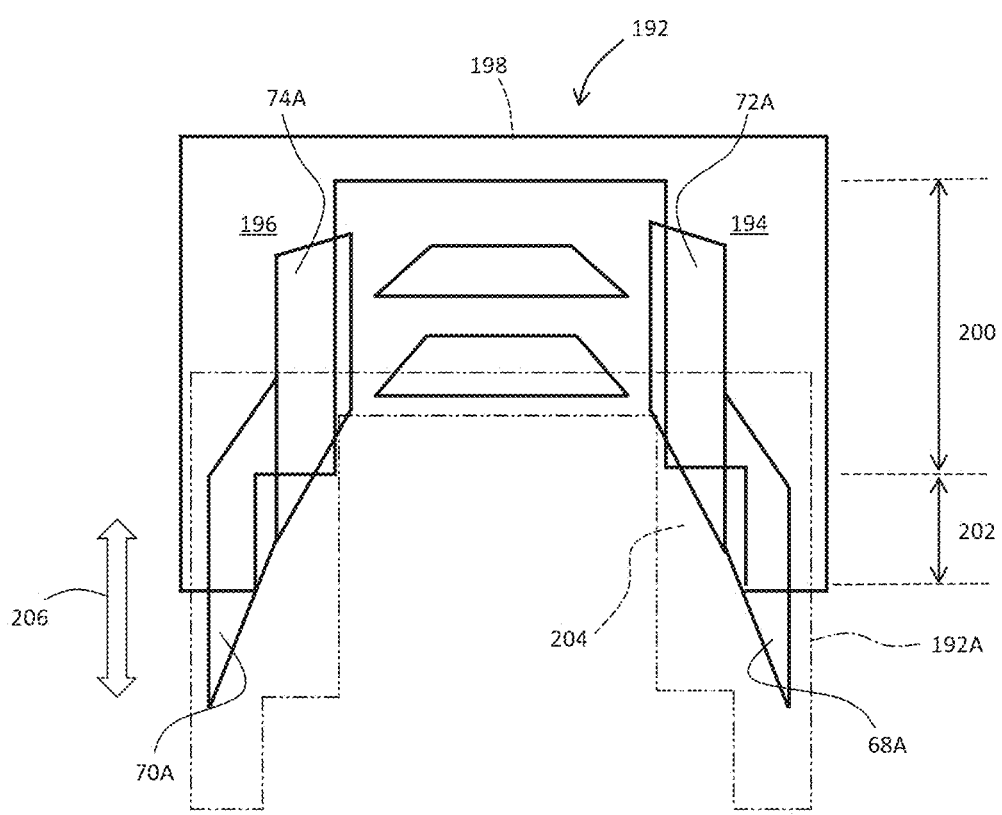
FIG. 14 is a diagram showing a fourth alternative configuration.

FIG. 14 shows a fourth alternative configuration. In front of the mirror unit, a mask member 192 is provided in a manner to allow an up-and-down movement. The mask member corresponds to the first mask member and the second mask member described above, and may also be called a composite mask member. The mask member 192 has legs 194 and 196 and a connection portion 198. Of the legs 194 and 196, an upper part 200 has a function to mask both the preceding mirrors 68A and 70A and the following mirrors 72A and 74A, similar to the second mask member described above in the third alternative configuration. Of the legs 194 and 196, a lower part 202 has a function to mask only the preceding mirrors 68A and 70A, similar to the first mask member described above in the third alternative configuration (mask member shown in FIG. 6).

As shown by reference numeral 206, when the upper part 200 is to function, the mask member 192 is lowered to a first position which is a lowered position (reference numeral 192A). When the lower part 202 is to function, the mask member 192 is raised to a second position which is a raised position. In this manner, with an operation on the form of the mask member 192, a plurality of functions may be provided to the mask member 192, and, with a selection of the height, the function to be actually realized is selected.

FIG. 15 shows functions or actions of various constituting elements in the fourth alternative configuration. When the low energy X-ray measurement is executed during calibration (refer to reference numeral 210), the first diffraction grating is selected, and both the preceding mirror pair and the following mirror pair are masked by the mask member. When the high energy X-ray measurement is executed during the calibration (refer to reference numeral 212), the second diffraction grating is selected, and, similar to the above, both the preceding mirror pair and the following mirror pair are masked by the mask member. On the other hand, when the low energy X-ray measurement is executed during sample observation (refer to reference numeral 214), the first diffraction grating is selected, the mask member does not function, and the preceding mirror pair and the following mirror pair function. When the high energy X-ray measurement is executed during the sample observation (refer to reference numeral 216), the second diffraction grating is selected, the mask member functions, and the preceding mirror pair is disabled. Only the following mirror pair functions.

Figure 16:
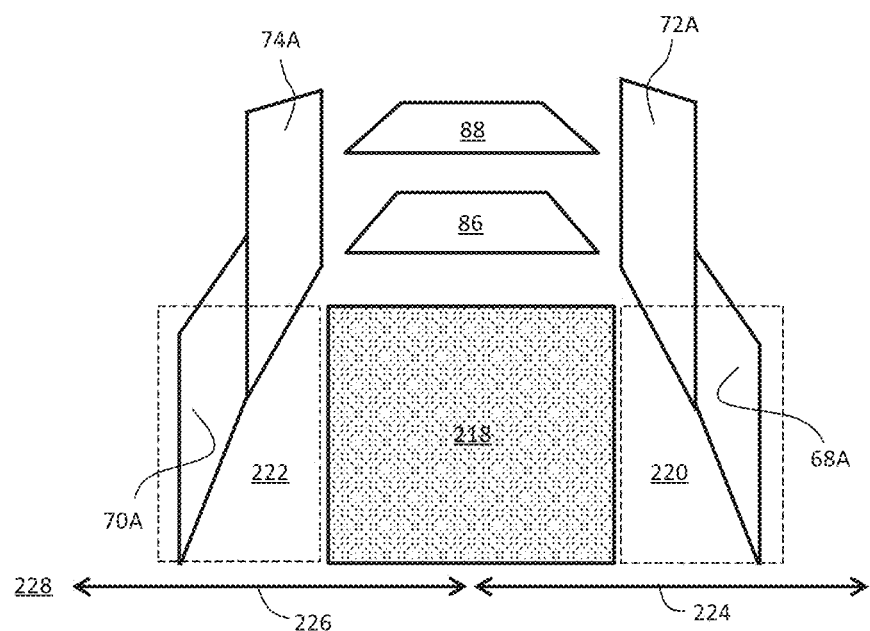
FIG. 16 is a diagram showing a fifth alternative configuration.

FIG. 16 shows a fifth alternative configuration. At a position in front of the mirror unit; that is, at the entrance opening, a first mask member 228 and a third mask member 218 are selectively placed. A slide motion of the first mask member 228 is shown by reference numeral 226. A slide motion of the third mask member 218 is shown by reference numeral 224.

The first mask member 228 is the mask member shown in FIG. 6. On the other hand, the mask member 218 blocks all of the X-rays which are directly incident on the first diffraction grating 86 and the second diffraction grating 88. The mirrors 68A, 70A, 72A, and 74A of the mirror unit are not masked, and are exposed. Only the reflective X-ray reaches the first diffraction grating 86 and the second diffraction grating 88. For example, the third mask member 218 of such a structure may be used during placement or adjustment of the mirror unit. During the sample observation, the third mask member 218 is retracted, and the first mask member 228 is placed at the entrance opening. In the illustrated configuration, a sliding direction of the first mask member 228 and the third mask member 218 is the left-and-right direction on the page of the figure, but alternatively, the slide direction may be set to the up-and-down direction on the page of the figure.

Figure 17:
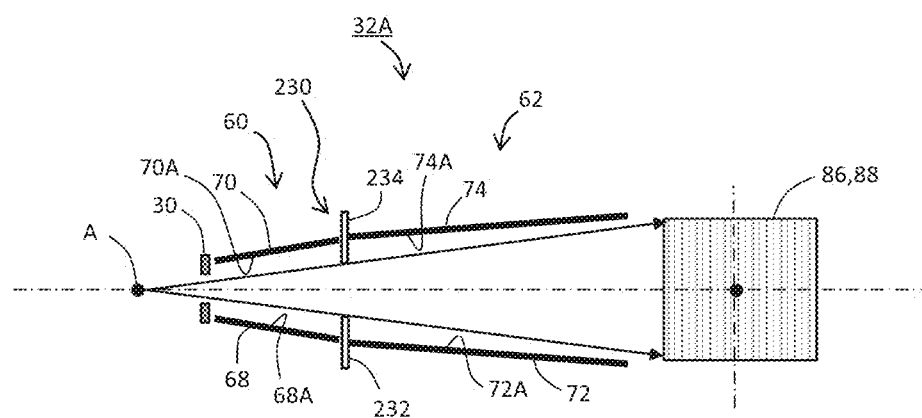
FIG. 17 is a diagram showing a sixth alternative configuration.

FIG. 17 shows a sixth alternative configuration. In FIG. 17, elements similar to the elements shown in FIG. 5 are assigned the same reference numerals. A mirror unit 32A is provided between the observation point A and the diffraction gratings 86 and 88. The mirror unit 32A has the preceding mirror plate pair 60 and the following mirror plate pair 62. The preceding mirror plate pair 60 is formed from two mirror plates 68 and 70, which have preceding mirrors 68A and 70A. The following mirror plate pair is formed from two mirror plates 72 and 74, which have following mirrors 72A and 74A. At an entrance opening of the mirror unit 32A, the first mask member 30 is provided.

In the illustrated example configuration, a gap exists between the mirror plate 68 and the mirror plate 72, and a mask plate 232 is placed in this gap. Similarly, a gap exists between the mirror plate 70 and the mirror plate 74, and a mask plate 234 is placed in this gap. The mask plate 232 and the mask plate 234 are connected to each other via a connection portion (not shown). A second mask member 230 is formed from the mask plates 232 and 234 and the connection portion. The second mask member 230 slides between an introduced position and a retracted position by a transport mechanism (not shown). A direction of the slide motion is, for example, a direction penetrating through the page of the figure.

The first mask member 30 is fixedly placed at the entrance opening, but alternatively, the first mask member may be slid between the entrance opening and a retracted position. In this case, a direction of the slide motion is, for example, the direction penetrating through the page of the figure.

During sample observation, a retracted state of the second mask member 230 is formed, and the first mask member 30 functions. That is, when the high energy X-ray measurement is executed, the X-ray reflection regions of the preceding mirrors 68A and 70A are masked by the first mask member 30.

During calibration, the second mask member 230 is introduced. The second mask member 230 in the introduced state blocks the reflective X-ray from the preceding mirrors 68A and 70A, and also blocks the X-ray propagating from the observation point A toward the following mirrors 72A and 74A. In other words, the second mask member 230 ultimately masks the entirety of the reflective surface. The only X-ray reaching the diffraction gratings 86 and 88 is the direct X-ray. In this manner, the second mask member 230 realizes the same function as the second mask member 174 shown in FIG. 12.

As a mechanism for transporting the second mask member 230, various mechanisms may be employed. For example, a slide mechanism, a rotation mechanism, or the like may be employed. In any of the alternative configurations described above, when the high energy X-ray measurement is executed during the sample observation, the mask member can effectively function, and the aberration can thereby be reduced.

The invention claimed is:

1. An X-ray detection apparatus comprising:
a mirror unit comprising a reflective surface which applies light collection on an X-ray from an observation point on a sample;
a spectroscopic device that applies spectral dispersion on the X-ray from the mirror unit, to thereby generate a dispersed X-ray which is spatially spread;
an X-ray detector that detects the dispersed X-ray; and
a mask member that is provided between the observation point and the mirror unit, and that partially covers the reflective surface, to thereby limit a reflective X-ray which is reflected by the reflective surface and reaches the spectroscopic device, wherein
the spectroscopic device comprises a first diffraction grating and a second diffraction grating which are selectively used,
the first diffraction grating is placed at a first position when the first diffraction grating is used,
the second diffraction grating is placed at a second position shifted from the first position in a first direction when the second diffraction grating is used, and
the mask member limits the reflective X-ray reaching the second diffraction grating.

2. The X-ray detection apparatus according to claim 1, wherein
the mirror unit comprises:
a preceding subunit having two preceding mirrors which are distanced away from each other in a second direction orthogonal to the first direction; and
a following subunit having two following mirrors which are distanced away from each other in the second direction,
the reflective surface includes the two preceding mirrors, and the two following mirrors, and
the mask member covers an entirety or a part of each of the preceding mirrors so that the mask member does not function when the first diffraction grating is used, and the reflective X-ray reaching the second diffraction grating is limited when the second diffraction grating is used.

3. The X-ray detection apparatus according to claim 2, wherein
the preceding subunit has an entrance opening, and
the mask member is provided at the entrance opening.

4. The X-ray detection apparatus according to claim 3, further comprising:
a movement mechanism that places the mask member at the entrance opening when a priority-on-aberration-suppression mode is selected, and that retracts the mask member from the entrance opening when a priority-on-sensitivity mode is selected.

5. The X-ray detection apparatus according to claim 2, wherein
the mask member comprises a pair of mask plates which are distanced away from each other in the second direction, and
the mask plates cover the entirety or the part of each of the preceding mirrors when the second diffraction grating is used.

6. The X-ray detection apparatus according to claim 5, wherein
the mask member comprises a connection plate which connects the pair of mask plates.

7. An X-ray detection apparatus comprising:
a mirror unit comprising a reflective surface which applies light collection on an X-ray from an observation point on a sample;
a spectroscopic device that applies spectral dispersion on the X-ray from the mirror unit, to thereby generate a dispersed X-ray which is spatially spread;
an X-ray detector that detects the dispersed X-ray; and
a mask member that is provided between the observation point and the mirror unit, and that partially covers the reflective surface, to thereby limit a reflective X-ray which is reflected by the reflective surface and reaches the spectroscopic device, wherein
the mask member is a first mask member which functions when the sample is observed, and
the X-ray detection apparatus further comprises:
a second mask member that is provided between the observation point and the spectroscopic device, that functions during calibration, and that allows a direct X-ray from the observation point to reach the spectroscopic device, and prevents the reflective X-ray from the reflective surface from reaching the spectroscopic device; and
a mechanism that causes the first mask member and the second mask member to selectively function.

8. A method of detecting an X-ray, the method comprising:
applying, with a mirror unit, light collection on an X-ray from an observation point on a sample;
applying, with a spectroscopic device that comprises a first diffraction grating and a second diffraction grating which are selectively used, spectral dispersion on an X-ray from the mirror unit by placing the first diffraction grating at a first position when the first diffraction grating is used and placing the second diffraction grating at a second position shifted from the first position in a first direction when the second diffraction grating is used, to thereby generate a dispersed X-ray which is spatially spread;
detecting the dispersed X-ray; and
covering, with a mask member and at a location between the observation point and the mirror unit, a portion, of a reflective surface of the mirror unit, which causes an aberration, to thereby limit a reflective X-ray which is reflected by the reflective surface and reaches the second diffraction grating of the spectroscopic device.

* * * * *